United States Patent
Shurtliff et al.

[11] Patent Number: 6,006,391
[45] Date of Patent: Dec. 28, 1999

[54] WORKPIECE CLEANING ELEMENT WITH IMPROVED RIB CONFIGURATION

[75] Inventors: Eric Shurtliff, Phoenix; Thomas Waddle, Avondale, both of Ariz.

[73] Assignee: SpeedFam-IPEC Corporation, Chandler, Ariz.

[21] Appl. No.: 08/967,162

[22] Filed: Nov. 10, 1997

[51] Int. Cl.$^6$ .............................. B08B 1/04; B08B 11/00
[52] U.S. Cl. .................... 15/102; 15/97.1; 15/230.16; 15/244.1
[58] Field of Search ............................ 15/230.16, 230.18, 15/97.1, 102, 230.12, 230.14, 230, 98, 244.1, 77, 385, 188, 245, 118

[56] References Cited

U.S. PATENT DOCUMENTS

| | | | |
|---|---|---|---|
| 1,775,186 | 9/1930 | Bartling | 15/97.1 |
| 1,809,907 | 6/1931 | Newcomb | 15/230 |
| 2,289,545 | 7/1942 | Horton et al. | 15/250.41 |
| 2,677,142 | 5/1954 | Mundo | 15/230 |
| 2,757,491 | 8/1956 | Galey | 15/230.16 |
| 2,880,432 | 4/1959 | Schnider et al. | 15/230.16 |
| 2,880,443 | 4/1959 | Le Febvre | 15/244.1 |
| 3,418,675 | 12/1968 | Meguiar et al. | 15/230 |
| 5,144,711 | 9/1992 | Gill, Jr. | 15/97.1 |
| 5,311,634 | 5/1994 | Andros | 15/97.1 |
| 5,461,750 | 10/1995 | Kaiser | 15/230 |
| 5,778,481 | 7/1998 | Amsden | 15/97.1 |

FOREIGN PATENT DOCUMENTS

| | | | |
|---|---|---|---|
| 662405 | 8/1929 | France | 15/97.1 |
| 798265 | 3/1936 | France | 15/385 |
| 856480 | 3/1940 | France | 15/230 |
| 1-254110 | 10/1989 | Japan . | |
| 914315 | 1/1963 | United Kingdom | 15/230.16 |

*Primary Examiner*—Gary K. Graham
*Attorney, Agent, or Firm*—Snell & Wilmer

[57] ABSTRACT

A workpiece cleaning element incorporates an injection molded resin core having integral spacers formed at a central portion of the resin core. The resin core is formed from a suitable material that does not leech chemicals or become brittle in the presence of cleaning fluids. A substantially resilient cleaning material located on the resin core includes a plurality of raised ribs that perform contact scrubbing of the workpiece. Each rib includes a longitudinal channel formed therein that divides the rib into a leading cleaner surface and a trailing cleaner surface. The ribs are arranged on the cleaning element in a pattern that promotes effective removal of debris from an inner position on the workpiece to the outer edge of the workpiece.

14 Claims, 4 Drawing Sheets

WORKPIECE CLEANING ELEMENT WITH IMPROVED RIB CONFIGURATION

FIELD OF THE INVENTION

The present invention relates generally to a scrubbing element for cleaning flat workpieces. More particularly, the present invention relates to an improved scrubbing element that includes a molded resin core and cleaning material having an improved rib configuration.

BACKGROUND OF THE INVENTION

The production of workpieces used in the magnetic disc drive industry begins with the creation of a substrate with a hard smooth surface upon which magnetic material can be deposited. A hard smooth surface may be formed by coating a relatively soft material such as aluminum with a relatively hard material such as nickel. The hard material is polished to a smooth finish, and magnetic material is then deposited onto the polished surface of the workpiece. Several methods for depositing magnetic material onto the polished surface can be used; for example, electro-deposition and sputtering are two well known methods.

After polishing, the workpieces are typically cleaned prior to the deposition of magnetic material. If the surface of the workpiece is contaminated with debris from the polishing process or elsewhere, the adherence of the magnetic material to the surface of the workpiece will be imperfect, and "blisters" of missing magnetic material may form on the surface of the workpiece. These "blisters" create areas on the completed magnetic disc that are incapable of storing information. Similarly, in optical disc manufacturing, debris on the surface of the workpiece may cause voids in information storage. In semiconductor wafer manufacturing, debris may attach to the surface of the workpiece, causing defects on the surface of the workpiece. These defects can cause electrical shorts or other problems within the microelectronic structures on the workpiece. Accordingly, it is often important to clean the workpieces to remove debris from the corresponding surfaces.

Contact scrubbing with sponge-like material is one method used to remove debris from the surface of the workpiece. A typical prior art cleaning element used for contact scrubbing of workpieces is described in U.S. Pat. No. 5,311,634, issued May 17, 1994 to Andros. A conventional cleaning element 10 may be configured as shown in FIG. 1. Cleaning element 10 generally includes a sponge-like cleaning material 12 and a core 14. Cleaning material 12 is formed over core 14 and seals with itself at an outer edge 16 of core 14. Cleaning material 12 may be made of a variety of resilient materials, including polyvinyl alcohol and urethane. As with other prior art cleaning elements, cleaning material 12 may have bumps or other texturing on its outer surface to facilitate effective cleaning and flushing of the workpiece surface. The arrangement of such bumps or texturing may be random or patterned. Random texturing may not provide a suitable cleaning or wiping action and some patterned cleaning elements may merely redistribute debris from one location on the workpiece to another without effectively removing the debris.

Conventional cleaning elements often utilize a relatively heavy and expensive metal or stamped plastic or polyvinyl chloride (PVC) for core 14. Unfortunately, PVC may leech chemicals or particulate into the cleaning environment during use. Such leeching is undesirable in many delicate applications. In addition, some conventional cleaning elements utilize a permanent core 14 that is designed for use with disposable sponge elements. Such an arrangement is inconvenient to maintain and requires a considerable amount of downtime to replace old sponges with new sponges.

Core 14 has a centrally located aperture 18 to allow mounting of cleaning element 10 onto a rotatable drive shaft 20. Core 14 may also have two keyways 22 and 24 formed within aperture 18 and configured to receive a single key 26 located on drive shaft 20. Key 26 and keyways 22 and 24 enable drive shaft 20 and cleaning element 10 to rotate as a single unit. Prior art cleaning element 10 uses such multiple keyways 22, 24 to facilitate adjustable alignment of the texture pattern on cleaning material 12. For example, cleaning elements 10 are typically installed onto drive shaft 20 using alternating keyways 22, 24 to stagger the respective texture patterns. Unfortunately, such an alternating configuration requires additional installation time and increases the likelihood of an improper installation.

Prior art cleaning machines may employ a plurality of cleaning elements 10 to simultaneously process a plurality of workpieces. When multiple cleaning devices 10 are placed on drive shaft 20, a number of spacers 28 are often interposed between adjacent cleaning devices 10 to ensure substantially identical spacing between all cleaning devices 10. Unfortunately, installing spacers 28 onto drive shaft 20 is time consuming and labor intensive. Spacers 28 also tend to wear and become contaminated, causing nonuniform spacing between and misalignment of cleaning devices 10. Such inconsistencies may cause unpredictable processing from workpiece to workpiece.

SUMMARY OF THE INVENTION

Accordingly, it is an advantage of the present invention that an improved workpiece cleaning element is provided that overcomes the limitations of the prior art.

Another advantage of the present invention is that the cleaning element does not leech chemicals or particulate into the workpiece environment during processing.

A further advantage is that the cleaning element employs a disposable plastic resin core that enables easy replacement of the cleaning element without a considerable amount of downtime.

Another advantage of the present invention is that it provides a cleaning element with an integral spacer that facilitates consistent alignment and orientation of the cleaning element.

An additional advantage is that the present invention provides a cleaning element having an improved rib pattern that enables effective removal of debris from workpieces.

The above and other advantages of the present invention are carried out in one form by a cleaning element for mechanical scrubbing of a surface of a workpiece. The cleaning element preferably includes a substantially rigid core and a substantially resilient cleaning material coupled to the core. The cleaning material employs a raised rib, which includes a longitudinal channel formed therein.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF A PREFERRED EXEMPLARY EMBODIMENT

The present invention relates to an improved cleaning element useful in cleaning workpieces. While the present invention may be used to clean a large variety of workpieces and associated surfaces, the preferred exemplary embodiments discussed herein relate to the cleaning of semiconductor wafers, magnetic discs, and optical discs. It will be understood, however, that the present invention is not limited to cleaning any particular workpieces; rather, the subject invention can be advantageously used in connection with a variety of possible workpiece configurations.

Figure 1:
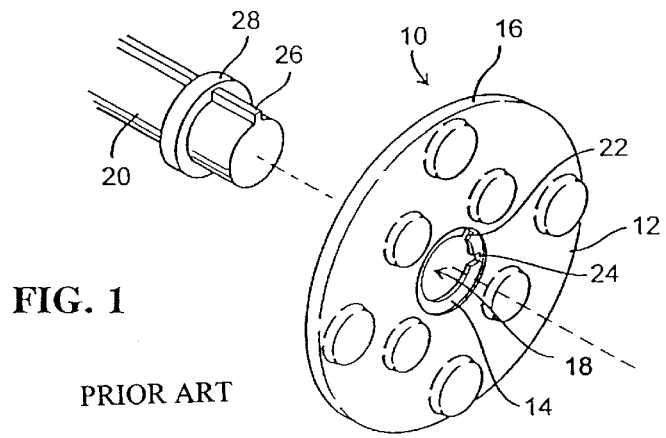
FIG. 1 is an exploded perspective view of a prior art cleaning element and corresponding drive shaft.
Figure 2:
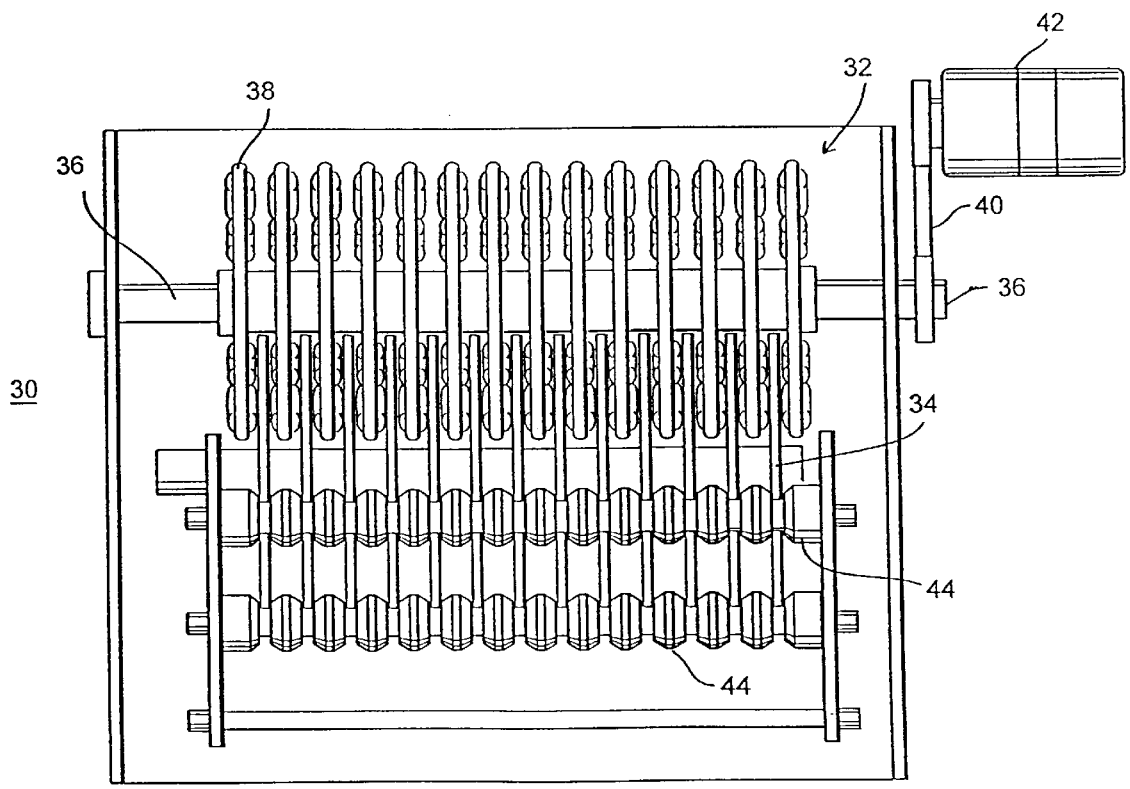
FIG. 2 is a cut-away side view of an exemplary workpiece cleaning system that utilizes cleaning elements according to the present invention.

With reference to FIG. 2, one technique for cleaning workpieces involves the use of a cleaning system 30 that suitably includes a cleaning assembly 32. Cleaning assembly 32 is preferably configured to clean a plurality of workpieces 34, e.g, semiconductor wafers, magnetic recording discs, or optical recording discs. Cleaning assembly 32 suitably includes a rotatable drive shaft 36 with several cleaning elements 38 attached thereto. Cleaning assembly 32 may include any number of cleaning elements 38 configured to clean the surfaces of workpieces 34. Drive shaft 36 may be driven by a belt 40, which can be driven by a motor 42 or other suitable mechanism. Drive shaft 36 is just one example of a means for moving cleaning elements 38 relative to workpieces 34, which may be located between neighboring cleaning elements 38. Of course, other appropriate components could be utilized to accomplish the same result.

Figure 3:
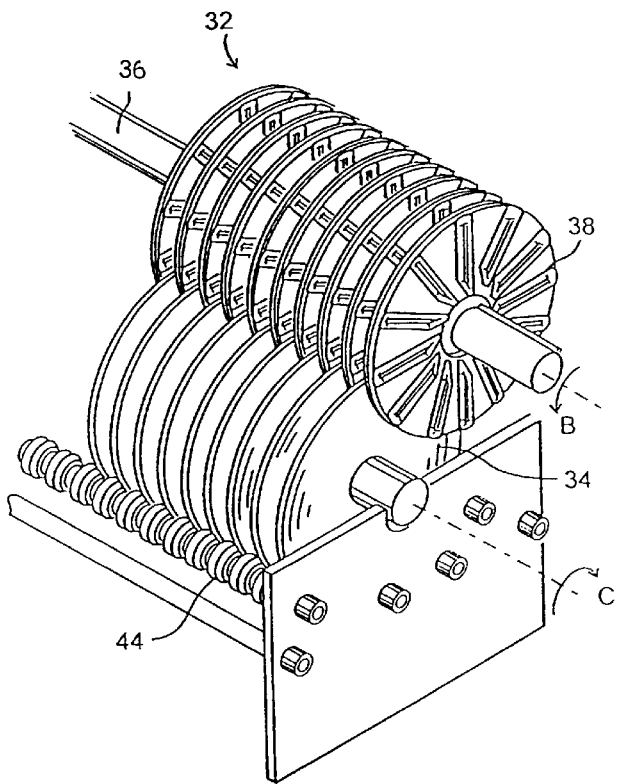
FIG. 3 is a perspective view showing the cleaning system in operation with a plurality of workpieces.

With reference to FIGS. 2–3, cleaning assembly 32, which preferably includes a plurality of substantially similar cleaning elements 38 arranged in a parallel configuration, cleans workpieces 34 as respective cleaning elements 38 contact and move relative to the surfaces of workpieces 34. In the exemplary embodiment illustrated in FIG. 3, cleaning assembly 32 rotates in the direction shown by arrow B. Although the specific direction of rotation is not a requirement of the present invention, collection and removal of debris from workpieces 34 may be enhanced by virtue of the configuration of ribs upon cleaning elements 38 (described below) combined with a particular rotational direction. Workpieces 34 may be placed on a number of rollers 44 such that they are free to rotate in the direction shown by arrow C. Alternatively, workpieces 34 may be driven in a suitable direction relative to cleaning elements 38. As described above, workpieces 34 are preferably interposed between two cleaning elements 38, allowing both sides of each workpiece 34 to be cleaned simultaneously. One aspect of the cleaning occurs as cleaning element 38 moves relative to workpieces 34 and debris on the surface of workpieces 34 becomes trapped in a portion of cleaning element 38 and is removed from the surface of workpiece 34 (described in more detail below).

To minimize scratching of the surfaces of workpieces 34, the cleaning often takes place in the presence of a liquid such as deionized water. Cleaning elements 38 may be kept moist by spraying the liquid over cleaning elements 38 and workpieces 34 or by keeping cleaning elements 38 immersed in the liquid. The liquid provides lubrication during the cleaning process and aids in the flushing of debris from cleaning elements 38 and workpieces 34.

The use of cleaning solutions or deionized water may have a detrimental effect on conventional cleaning elements that utilize a stamped PVC (or other plastic) core. For example, deionized water may remove the plasticizers in such PVC cores and cause the PVC cores to become overly brittle. PVC and other core materials may also leech chemicals or particulate into the cleaning environment during use; such chemicals or particulate may cause nonuniform cleaning or damage to workpieces. Some prior art cleaning elements may employ a metallic core designed for use with removable and replaceable cleaning material. Such cleaning elements may be costly to manufacture and maintain, and the use of removable cleaning material may cause nonuniform cleaning from workpiece to workpiece.

Figure 4:
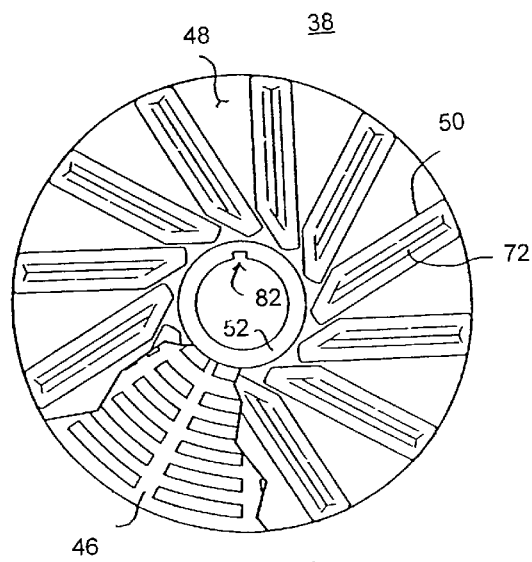
FIG. 4 is a partially cut-away plan view of a cleaning element according to the present invention.

FIG. 4 is a partially cut-away view of cleaning element 38, showing a substantially rigid core 46 configured in accordance with the present invention. Core 46 overcomes the above, and other, disadvantages of prior art cores utilized for resilient cleaning sponges. Core 46 is preferably a one-piece assembly that may be molded from a plastic resin material. In one exemplary embodiment, core 46 is formed from ULTEM 1000, which is a resin (commercially available from the Polymerland division of General Electric) that is suitable for injection molding. This material is particularly suited for the present application because it is unreinforced with glass or other fillers that may otherwise leech into the cleaning environment and contaminate or damage the workpieces. Of course, core 46 may be formed from any suitable material known to those skilled in the art. Unlike stamped PVC material, which may become warped or deformed after use, core 46 is preferably formed from a suitable material that is substantially resistant to permanent warping caused by external forces applied thereto. Core 46 is preferably formed such that it exhibits substantially no leeching of chemicals, oils, or particulate when exposed to fluids, e.g., deionized water.

A substantially resilient cleaning material 48 may be integrally formed upon or otherwise coupled to core 46. In the preferred embodiment, cleaning material 48 is formed by "growing" a sponge-like polyvinyl alcohol (PVA) over core 46. It should be appreciated that a number of alternate compositions, such as urethane, may be utilized to form cleaning material 48. As described in more detail below, cleaning material 48 may include a plurality of raised ribs 50 arranged to facilitate efficient cleaning of workpieces 34 and removal of debris from workpieces 34.

Figure 5:
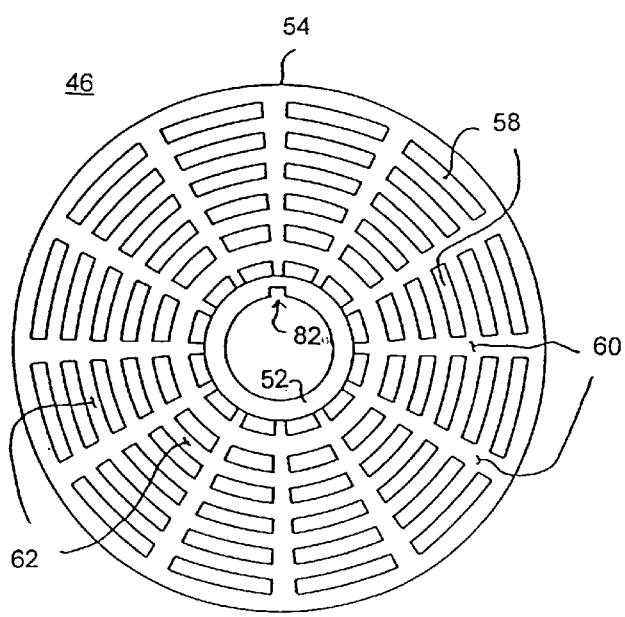
FIG. 5 is a plan view of a molded core utilized by the cleaning element.
Figure 6:
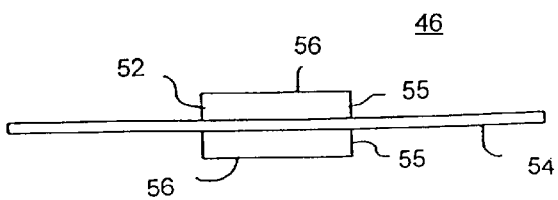
FIG. 6 is a side view of the molded core shown in FIG. 5.

As shown in FIGS. 4–6, core 46 (and, consequently, cleaning element 38) is substantially disc-shaped, which accommodates rotational cleaning of workpieces 34. In particular, core 46 includes a central hub 52 configured to receive drive shaft 36, and a substantially disc-shaped plate 54 extending from central hub 52. Cleaning material 48 may be formed such that it substantially covers plate 54, leaving central hub 52 exposed. Central hub 52 is cylindrical in shape and plate 54 may be configured such that it centrally intersects central hub 52 perpendicular to the longitudinal axis of central hub 52 (see FIG. 6). In other words, central hub 52 preferably forms two integral spacers 55 that are of equal height relative to plate 54. These spacers 55 may be employed in lieu of the separate spacers associated with many prior art applications. The use of integral spacers 55 reduces the number of gaps between components mounted to drive shaft 36. The reduction of such gaps is desirable because bacteria, loose debris, and other contaminants may collect within such gaps. Furthermore, the use of integral spacers 55 increases the structural integrity of central hub 52, which increases the rotational stability of cleaning element 38 and strengthens the area that receives drive shaft 36.

The use of spacers 55 helps ensure that substantially similar pressure is applied to each workpiece 34 by the various cleaning elements 38. Similar pressure, in turn, helps ensure that each surface of each workpiece 34 is consistently cleaned. To facilitate proper alignment and substantially parallel installation of cleaning elements 38, central hub 52 preferably terminates to form a bearing surface 56. Bearing surface 56 defines a plane that is substantially parallel to plate 54, as depicted in FIG. 6.

To enable effective coupling of cleaning material 48 to core 46, and to increase the durability of cleaning material 48, core 46 may be configured such that a plurality of openings 58 are formed therein. Openings 58 enable an ample amount of cleaning material 48 to pass through core 46 during the molding process. As best shown in FIG. 5, plate 54 preferably includes a plurality of spokes 60 radiating from central hub 52 and a plurality of interconnecting members 62 integrally formed between spokes 60. Spokes 60 and interconnecting members 62 are arranged to define openings 58 therebetween. The exemplary resin material used to form core 46, e.g., ULTEM 1000, is selected such that core 46 has sufficient structural rigidity while having an increased area associated with openings 58. Furthermore, core 46 may be designed such that it exhibits a moderate amount of elasticity and flexibility while retaining a significant degree of physical memory (i.e., core 46 returns to its original shape after deflection). ULTEM 1000 is a preferred material because it does not contain any plasticizers, which are often removed from PVC cores used by prior art cleaning elements when exposed to fluids such as deionized water. The removal of plasticizers from PVC cores renders such cores undesirably brittle.

Figure 7:
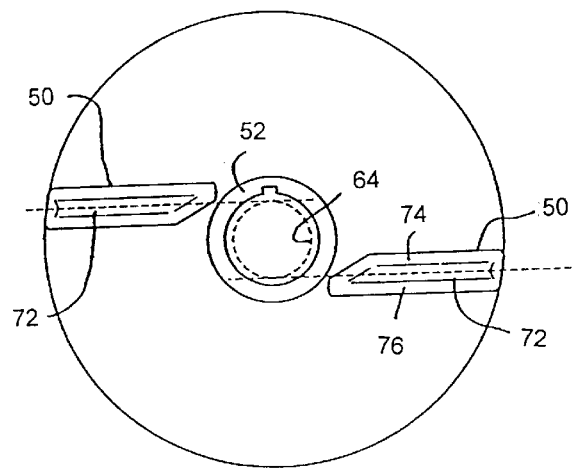
FIG. 7 is a top view of the cleaning element.

In the preferred exemplary embodiment, cleaning material 48 includes raised ribs 50, which may be integrally formed therein. As shown in FIG. 7, ribs 50 extend from a location proximate central hub 52 to a location proximate the outer edge of core 46. A small gap may be located between ribs 50 and central hub 52 to accommodate flushing and lubrication by deionized water or other suitable cleaning fluids. In the preferred embodiment, ribs 50 are relatively straight and their respective longitudinal axes are offset from the center of core 46. The longitudinal axes of ribs 50 may be tangent to an inner circle 64, which is substantially concentric with core 46. An exemplary inner circle 64 is shown in dashed lines in FIG. 7. Although not a requirement of the present invention, inner circle 64 is preferably sized such that its diameter is less than the outer diameter of central hub 52.

Figure 8:
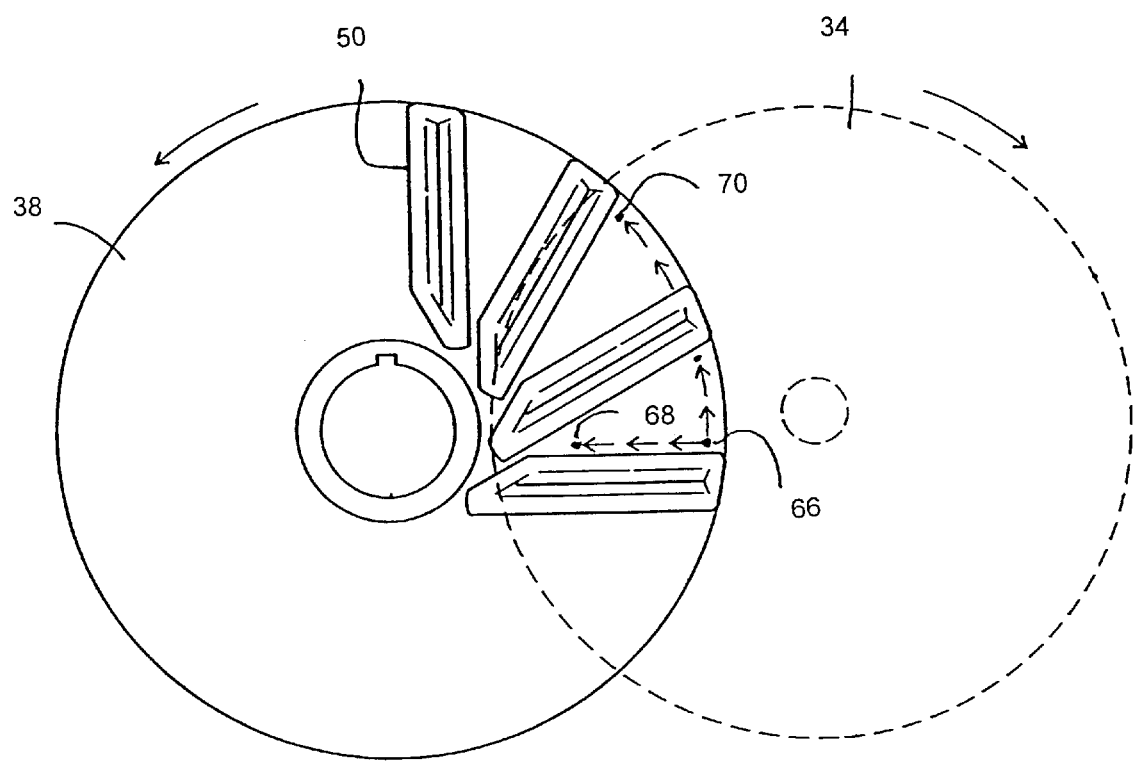
FIG. 8 is a top view of the cleaning element shown in FIG. 7, depicted in operation during processing of a workpiece.

The preferred arrangement of ribs 50 (described above) promotes the effective cleaning of workpieces 34. With reference to FIG. 8, ribs 50 are configured to brush each workpiece 34 such that debris is collected from an inner position 66 of workpiece 34 and subsequently removed from the outer edge of workpiece 34. Due to the angular orientation of ribs 50 and the rotational direction of cleaning element 38, debris may travel from inner position 66 and be collected within the "pocket" formed between two ribs 50, e.g., near an area 68 defined between two of said ribs 50 and proximate the center of core 46. Ribs 50 are also configured to brush workpiece 34 such that debris is moved from inner position 66 to an outer position 70 of workpiece 34. This sweeping motion enhances the collection of debris between adjacent ribs 50 without spreading loose debris onto a previously cleaned section of workpiece 34.

Figure 9:
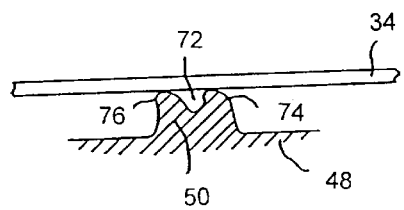
FIG. 9 is a side sectional view of a portion of the cleaning element in operation during processing of a workpiece.

In accordance with a preferred feature of the present invention, ribs 50 are configured such that their cleaning ability is enhanced. In particular, as best shown in FIGS. 7–9, each rib 50 may include a longitudinal channel 72 formed therein. Longitudinal channel 72 increases the effective cleaning surface area of each rib 50 without substantially increasing the amount of cleaning material 48 used during the manufacture of cleaning element 38. As shown in FIG. 7, longitudinal channel 72 may be substantially aligned with the longitudinal axis of the respective rib 50. Longitudinal channel 72 facilitates flushing of debris from workpiece 34 and rinsing of cleaning element 38. Additionally, longitudinal channel 72 divides the associated rib 50 into a leading cleaner surface 74 and a trailing cleaner surface 76. Cleaner surfaces 74, 76 facilitate a dual cleaning action with each rib 50, which may be desirable to reduce the amount of particulate spreading associated with conventional cleaning elements and to thereby improve the cleaning process.

Figure 10:
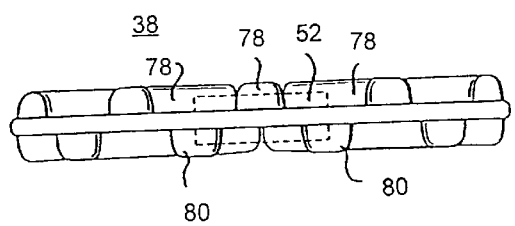
FIG. 10 is a side view of the cleaning element shown in FIG. 7.

FIG. 10 depicts a side view of cleaning element 38, showing the relative heights of central hub 52 and ribs 50. As described above, central hub 52 forms integral spacers 55 that extend beyond the plane defined by plate 54. In accordance with a preferred aspect of the present invention, ribs 50 extend beyond the same plane at least as far as central hub 52. In other words, ribs 50 are higher than central hub 52, as shown in FIG. 10. This configuration enables ribs 50 to impart pressure onto workpieces 34 when installed upon drive shaft 36. It should be appreciated that the specific height of ribs 50 and central hub 52 may vary according to the thickness of workpieces 34, the composition of cleaning material 48, the duration of the cleaning process, and other application-specific parameters. In the preferred embodiment, each of ribs 50 has a uniform height, which causes substantially uniform pressure to be applied to workpieces 34, resulting in substantially uniform cleaning over the surface of workpieces 34.

Cleaning element 38 may be configured such that ribs 50 on one side of plate 54 are offset from ribs 50 on the other side of plate 54 (see FIG. 10). In other words, the projections of a first number of ribs 78 onto core 46 are offset from the projections of a second number of ribs 80 onto core 46. Thus, when installed as shown in FIG. 3, ribs 50 associated with opposing cleaning elements 38 form an alternating arrangement relative to one another. This arrangement allows cleaning elements 38 to be attached to drive shaft 36 in a single direction using single keyway 82 (see FIG. 5), rather than requiring multiple keyways to facilitate offsetting of cleaning elements 38 during installation onto drive shaft 36. For purposes of this description, "offset" means that ribs 78 are not aligned with ribs 80. Offsetting ribs 78 from ribs 80 ensures substantially consistent pressure between workpieces 34 and cleaning elements 38. Such offsetting also reduces the stress imparted to workpieces 34 and reduces the amount of bending of workpieces 34 or cleaning elements 38.

It should be appreciated that the above description is of preferred exemplary embodiments and that the present invention is not limited to the specific forms shown herein. For example, the present invention may be alternately configured as a roller scrubbing element for use in a semiconductor cleaning assembly in which a semiconductor wafer is cleaned as it passes between upper and lower rollers. Such roller elements may utilize an injected molded resin core and a resilient cleaning material having any suitable texturing pattern. An exemplary roller element (or a disc-shaped cleaning element as described herein) may utilize a core formed with internal fluid channels configured to carry cleaning solution from the core to the resilient cleaning material located upon the core. Of course, these and various other modifications may be made to the design, arrangement, and composition of elements disclosed herein without departing from the scope of the invention as expressed in the appended claims.

What is claimed is:

1. A cleaning element for mechanical scrubbing of a surface of a workpiece, said cleaning element comprising:
   a substantially rigid one-piece core formed from a plastic resin material, said core being substantially resistant to permanent warping caused by external forces applied thereto; and
   a substantially resilient cleaning material integrally formed upon said core;
   wherein said core comprises a central hub configured to receive a drive shaft and a substantially disc-shaped plate extending from said central hub, and said cleaning material substantially covers said plate;
   wherein said plate comprises a plurality of spokes radiating from said central hub and
   a plurality of interconnecting members integrally formed between said spokes, said interconnecting members and said spokes defining a plurality of openings in said plate.

2. A cleaning element for mechanical scrubbing of a surface of a workpiece, said cleaning element comprising:
   a substantially rigid one-piece core formed from a plastic resin material, said core being substantially resistant to permanent warping caused by external forces applied thereto; and
   a substantially resilient cleaning material integrally formed upon said core;
   wherein said core comprises a central hub configured to receive a drive shaft and a substantially disc-shaped plate extending from said central hub, and said cleaning material substantially covers said plate;
   wherein said cleaning material comprises a raised rib integrally formed thereon and extending from a location proximate said central hub to a location proximate the outer edge of said core and
   said rib includes a longitudinal channel formed therein.

3. A cleaning element for mechanical scrubbing of a surface of a workpiece, said cleaning element comprising:
   a substantially disc-shaped rigid core; and
   a substantially resilient cleaning material coupled to said core, said cleaning material comprising a first raised rib integrally formed thereon;
   wherein said first raised rib includes a longitudinal channel formed therein and said first raised rib extends from a location proximate the center of said core to a location proximate the outer edge of said core, and a longitudinal axis of said first raised rib is tangent to an inner circle substantially concentric with said core;
   wherein said core comprises a substantially cylindrical central hub configured to receive a drive shaft and the diameter of said inner circle is less than the outer diameter of said central hub.

4. A cleaning element for mechanical scrubbing of a surface of a workpiece, said cleaning element comprising:
   a substantially disc-shaped rigid core; and
   a substantially resilient cleaning material coupled to said core, said cleaning material comprising a first raised rib integrally formed thereon, said first raised rib having a longitudinal channel formed therein;
   wherein said core comprises a central hub configured to receive a drive shaft and a substantially flat plate extending from said central hub;
   said central hub extends beyond the plane defined by said plate; and
   said first raised rib extends beyond said plane at least as far as said central hub.

5. A cleaning element for mechanical scrubbing of a surface of a workpiece, said cleaning element comprising:
   a substantially disc-shaped rigid core; and
   a substantially resilient cleaning material coupled to said core, said cleaning material comprising a first raised rib integrally formed thereon, said first raised rib having a longitudinal channel formed therein;
   wherein said first raised rib is located on a first side of said cleaning element;
   said cleaning material comprises a second raised rib integrally formed thereon, said second raised rib being located on a second side of said cleaning element; wherein
   the projections of said first and second raised ribs onto said core are offset from one another.

6. A system for cleaning workpieces comprising:
   first and second cleaning elements, each comprising:
      a substantially rigid one-piece core formed from a plastic resin material;
      a substantially resilient cleaning material coupled to said core; and
      a plurality of raised ribs integrally formed upon said cleaning material and configured such that said raised ribs associated with said first cleaning element oppose said raised ribs associated with said second cleaning element and such that said raised ribs associated with said first cleaning element and said raised ribs associated with said second cleaning element form an alternating arrangement relative to one another; and
   means for moving said first and second cleaning elements relative to a workpiece located between said first and second cleaning elements.

7. A system according to claim 6, wherein said first and second cleaning elements are substantially similar.

8. A system according to claim 7, wherein:
   said means for moving comprises a drive shaft configured to receive said first and second cleaning elements; and
   said first and second cleaning elements are aligned upon said drive shaft via a common keyway.

9. A system according to claim 6, wherein, for each of said first and second cleaning elements:
   said core comprises a central hub configured to receive said means for moving and a substantially disc-shaped plate integral to said central hub;
   said central hub extends beyond the plane defined by said plate to form an integral spacer; and said integral spacer facilitates substantially uniform spacing between said first and second cleaning elements.

10. A system according to claim 6, wherein, for each of said first and second cleaning elements, said raised ribs are configured to brush said workpiece such that debris is moved from an inner position of said workpiece to an outer position of said workpiece.

11. A cleaning system according to claim 10, wherein each of said raised ribs extends from a location proximate the center of said core to a location proximate the outer edge of said core.

12. A cleaning system according to claim 11, wherein:
said core is substantially disc-shaped; and
the longitudinal axes of said raised ribs are offset from said center of said core.

13. A cleaning system according to claim 11, wherein:
said core is substantially disc-shaped; and
the longitudinal axes of said raised ribs are tangent to an inner circle substantially concentric with said core.

14. A system according to claim 6, wherein, for each of said first and second cleaning elements, said raised ribs are configured to brush said workpiece such that debris travels to an area defined between two of said raised ribs proximate the center of said core.

* * * * *